United States Patent [19]

Sato et al.

[11] Patent Number: 4,479,028
[45] Date of Patent: Oct. 23, 1984

[54] AMORPHOUS SOLAR CELL

[75] Inventors: Kazuhiko Sato; Genshiro Nakamura; Yoshinori Yukimoto, all of Hyogo, Japan

[73] Assignee: Director General of Agency of Industrial Science and Technology, Tokyo, Japan

[21] Appl. No.: 427,341

[22] Filed: Sep. 29, 1982

[30] Foreign Application Priority Data

Feb. 15, 1982 [JP] Japan .................................. 57-21047

[51] Int. Cl.$^3$ ............................................. H01L 31/06
[52] U.S. Cl. ..................................... 136/249; 136/258
[58] Field of Search .................... 136/249 TJ, 258 AM

[56] References Cited

U.S. PATENT DOCUMENTS 4,377,723 3/1983 Dalal ............................ 136/249 TJ

OTHER PUBLICATIONS

G. Nakamura et al., "Tandem Type Solar Cells Using a-Si:H and a-SiGe:H Films", *J. de Physique*, Colloque C4, Suppl. No. 10, Tome 42, Oct. 1981, pp. C4-483 to C4-486.

Y. Marfaing, "Evaluation of Multijunction Structures Using Amorphous Si-Ge Alloys", *Proceedings, 2nd European Community Photovoltaic Solar Energy Conf.* (1979), Reidel Pub. Co. (1979), pp. 287-294.

*Primary Examiner*—Aaron Weisstuch
*Assistant Examiner*—Hunter L. Auyang
*Attorney, Agent, or Firm*—Sughrue, Mion, Zinn, Macpeak & Seas

[57] ABSTRACT

A solar cell of high transducing efficiency is provided in the form of a multi-cell laminated construction having n-type light receiving layers. A non-doped layer of the cell on the incident light side has an energy-gap higher than that of the lower cells.

7 Claims, 9 Drawing Figures

AMORPHOUS SOLAR CELL

BACKGROUND OF THE INVENTION

This invention relates to an amorphous solar cell and more particularly to a multilayer solar cell. Amorphous silicon (herein designated as a-Si:H) formed by glow discharge of SiH4 gas or deposition or sputtering has been actively used in new devices by reason that its valence electron can be easily controlled. The control of the valence electron is caused by the remarkable decrease of local level density in the band-gas of a-Si:H. Intense interest has been shown recently toward the amorphous silicon layer used in a solar cell because it can be formed with low cost. To achieve high efficiency in the solar cell is a very important subject for future study in the production of the cell.

But it is impossible to increase the efficiency of a conventional solar cell, so that the development of a new method of forming the solar cell is very important.

The a-Si:H layer formed by glow discharge has the possibility of improving the abilities of the solar cell as its properties, such as the diffusion length of minority carriers or the field intensity in a non-doped a-Si:H layer (herein designated as an i layer) are promising. The conventional a-Si:H layer has a band-gap energy of about 1.8 to 1.95 eV. On the other hand, the conventional solar cell uses a silicon layer, the most suitable band-gap energy of which is about 1.5 to 1.6 eV, so that the efficiency of the solar cell with the conventional a-Si:H layer is less than one with Si layer. In the a-Si:H layer, moreover, an i layer with a thickness of 0.4 to 0.6 μm limits the efficiency because of the short minority carrier diffusion length Δp of about 0.2 to 0.5 μm.

The low light-utilization efficiency is an essential defect of the conventional a-Si:H layer solar cell. It is necessary for an increase in the light-utilization efficiency to develop a new amorphous material with a high light absorption property, i.e., a low optical energy gap (Egopt). But the effective utilization of a low band-gap amorphous material involves the following technical problems:

1. The Egopt value of the a-Si:H layer formed by glow discharge does not depend on growth condition in the discharge method, such as the growth temperature, gas pressure, input gas quantity or FF power, so it is difficult to form an a-Si:H layer with an Egopt value selected from within a wide range in one growing apparatus.

2. An a-Si:H layer including fine silicon crystal particles (herein designated as μc.a-Si:H) is able to assume an Egopt value intermediate the values of a-Si:H and single crystal silicon with an Eg of 1.1 eV. An a-Si:H composition of mixed phase a-Si:H and a-Ge:H has an Egopt which is continuously changable from 1.0~1.1 eV to 1.85~1.9 eV. But these a-Si:H layers have many ill desired physical properties and are not utilized for solar cells.

SUMMARY OF THE INVENTION

This invention relates to a method of effectively utilizing an amorphous material with low band-gap energy for the solar cell.

DETAILED DESCRIPTION OF THE PREFERRED EMBODIMENTS

The transducing efficiency ($\eta$) of a solar cell is equal to the product of a fill factor of curve factor (FF), the short circuit current density (Jsc) and the open-circuit voltage (Voc) and photo-radiation intensity (Pin) of the cell. The efficiency $\eta$ can be represented by the following formula:

$$\eta = Voc \cdot Jsc \cdot FF / Pin$$

It is well known that the band-gap energy (Eg) of a material largely influences the open-circuit voltage (Voc), and an ideal open-circuit voltage (Voc) in an amorphous layer having a low local level density in the band-gap and a Fermi level (FF) placed in the center of the band is in proportion to the band-gap energy (Eg).

On the other hand, the short-circuit current density (Jsc) and the curve factor (FF) are important factors in using the low band-gap energy material effectively along with the open-circuit voltage (Voc).

Figure 1:
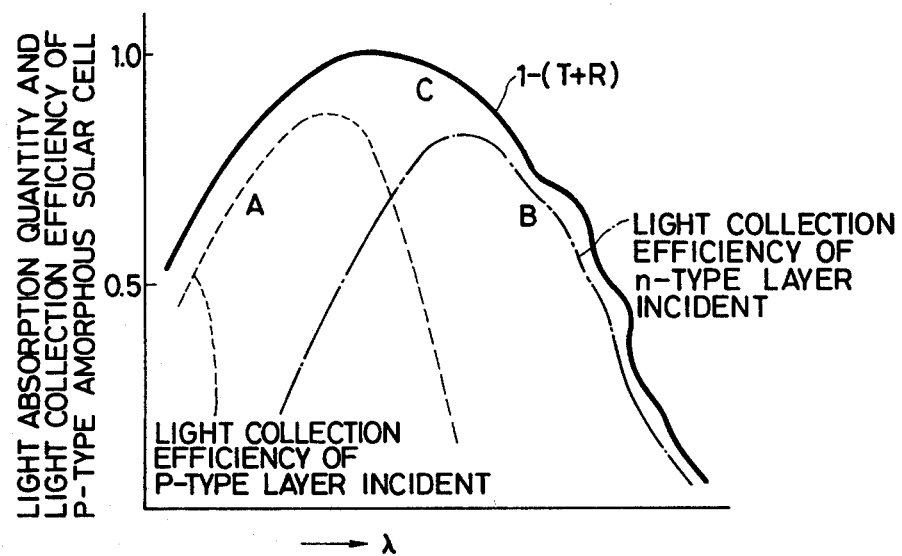
FIG. 1 is a graph representing the light absorption collection efficiency wavelength characteristic of an amorphous solar cell.

FIG. 1 shows the light absorption collection efficiency wavelength characteristic of an amorphous solar cell. In FIG. 1, A designates the case of radiating light onto the p-type layer, B designates the case of radiating light onto the n-type layer and C designates the quantity of light absorbed in the solar cell. C is almost equal to $1-(T(\lambda)+(R(\lambda))$, wherein $T(\lambda)$ designates the light reflection factor of the cell and $R(\lambda)$ designates the light transmission factor of the cell.

The hole diffusion length Lp is remarkably short compared with the electron diffusion length Ln in conventional amorphous materials, so that the photovoltaic current is controlled by the hole movement and the spectral sensitivity of the hole collection efficiency is determined by a drift probability of the hole into a boundary region between the p-type layer and the i layer.

When light is radiated onto the p-type layer, the collection efficiency of short-wavelength light increases and the drift probability of excited carrier holes generated by long-wavelength light near the boundary region of the n-type layer and i layer decreases. When light is absorbed by the n-type layer, the short-wavelength light absorption collection efficiency decreases but the long-wavelength light absorption collection efficiency is increased. It is advantageous to select the n-type layer as the light receiving surface. The decrease of the effect of the i layer in the cell has an influence on Jsc and FF.

In a solar cell with a light receiving n-type layer (herein designated as a nip cell), the trapping probability of a short wavelength light-excited carrier at the boundary of the p-type layer and the i layer is remarkably changed by the drift field intensity in the i layer, so that the i layer has an influence on the properties of the solar cell. In amorphous materials with different band-gap energies the short-wavelength light collection efficiency is decreased, if the energies Eg are small.

Figure 2:
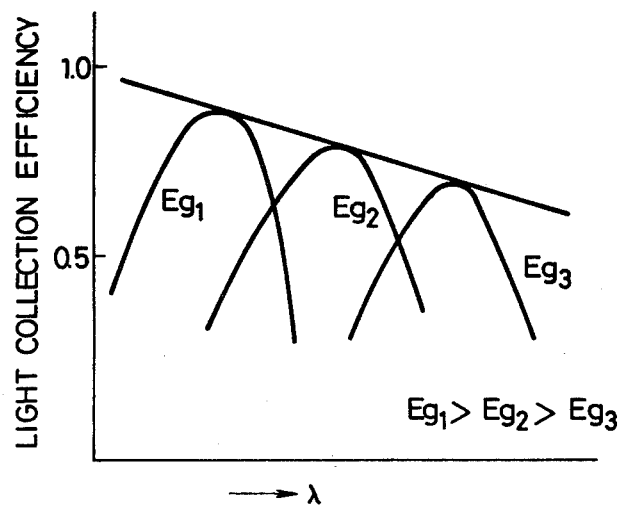
FIG. 2 illustrates the light collection efficiency-light wavelength characteristic of nip cells with i layers of different band-gap energies.

FIG. 2 shows the light collection efficiency wavelength characteristic in nip devices with i layers of diferenct band-gap energies. According to the decrease in Eg, the light collection efficiency is decreased. The transducing efficiency $\eta$ of the solar cell is increased according to an increase in Eg. The conventional a-Si:H layer has at best band-gap energy of about 1.85 to 2.0 eV. The $\mu$.c a-Si:H materials have a transducing efficiency lower than that of the a-Si:H layers.

Figure 3:
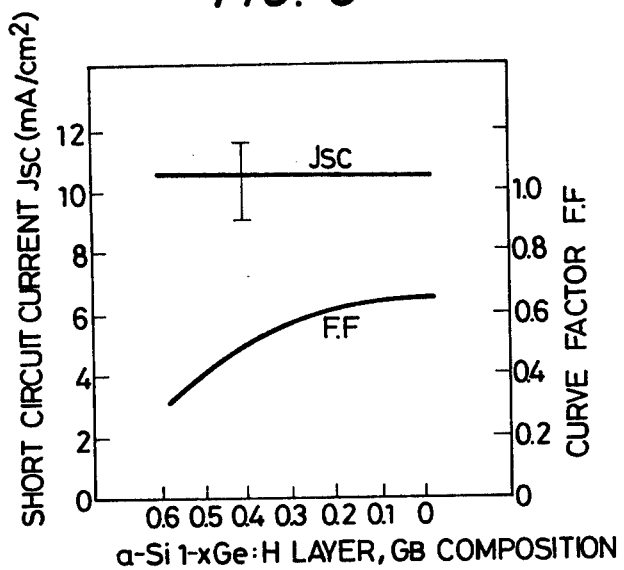
FIG. 3 shows the Ge content-Jsc and Ge content-FF characteristic of a nip single structure cell with a-Si:H layer including Ge.

FIG. 3 shows Jsc and FF characteristics versus Ge content in a nip device with an a-Si:H layer including Ge. It is difficult to improve the transducing efficiency of the nip or pin structure cell with a low band-gap energy material. The collection efficiency in the long wavelength region in the nip cell is improved by this invention. Multilayer structure increases the collection efficiency.

In this invention, at least two nip cell devices are laminated to form a solar cell with a first i layer at an incident light receiving side. This i layer has an energy-gap larger than the gap of a second i layer located in the second nip cell.

Figure 4:
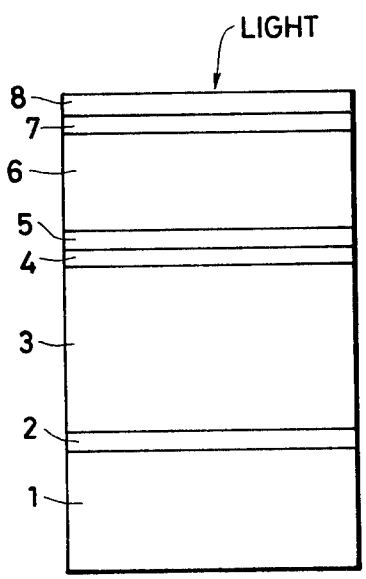
FIG. 4 is a sectional view of a double-layer tandem device.

FIG. 4 shows a multilayered solar cell connecting a nip cell with a low band-gap energy a-Si:H layer, and a nip cell with a high band-gap energy (herein designaged as double-layer tandem device).

In FIG. 4, reference numeral 1 designates a conductive substrate, 2 is a p-type amorphous silicon (a-Si:H) layer, 3 is an intrinsic (non-doped) amorphous silicon germanium (a-SiGe:H) layer, 4 is an n-type amorphous silicon (a-Si:H) layer, 5 is a p-type amorphous silicon (a-Si:H) layer, 6 is an intrinsic amorphous silicon (a-Si:H) layer, 7 is an n-type amorphous silicon (a-Si:H) layer and 8 is a transparent electrode. In the double-layer tandem device, an effective decrease in the short wavelength light collection efficiency caused by use of the nip single structure cell with a low band-gap energy a-Si:H layer is compensated by the photovoltaic current collecting ability of the high band-gap energy a-Si:H layer of the nip cell formed at the surface side of the device. The decrease of the short-wavelength light collecting efficiency of the a-Si:H nip single structure cell is fully compensated. The nip cell with the high band-gap energy a-Si:H layer is able to make use of the Voc-increasing effect caused by an increase in Eg.

In the production of the double-layer tandem device, it is necessary to pay attention to the following points:

1. In the pn-junction connecting the two cells, it is necessary to completely recombine excited electrons in the lower cell having the low band-gap energy layer and excited electrons in the upper cell having the high band-gap energy layer. A photovoltaic effect in the pn-junction region generates a backward voltage, so it is necessary to prevent the generation of the photovoltaic effect when light is radiated onto the tandem device. Generation of a sufficient diffusion potential is required for the i layers of the two cells and a decrease of the light absorption quantity in the pn-junction region is required, so that it is difficult to select the materials and the thickness of the doped layer. The pn-junction is formed by doping with B and P dopants in the a-Si:H layers. The impurities are doped into the a-Si:H layers in the form of $B_2H_6$ and $PH_3$ gases when these layers are formed by glow discharge. When the gas mol ratio of $B_2H_6/B_2H_6+SiH_4+PH_3/PH_3+SiH_4$ is above 0.1, the above requirements are practically satisfied. The quantity of light absorption in the pn-junction region is decreased by the use of a doped layer of a p-type $\mu$.c a-Si:H or an n-type $\mu$.c a-Si:H including fine cystal particles having low visible light absorbing ability. A similar decrease is caused by the use of a carbon doped a-Si:H layer with a high band-gap energy. The thickness of the doped layer is about 50 to 200 Å to generate a sufficient diffusion potential and to decrease light absorption.

2. In the double-layer tandem device, the maximum output current is generated when the photovoltaic current of one of the two cells is equal to the photovoltaic current of the other cell, so it is very important to select suitable thicknesses of the cells.

Figure 5:
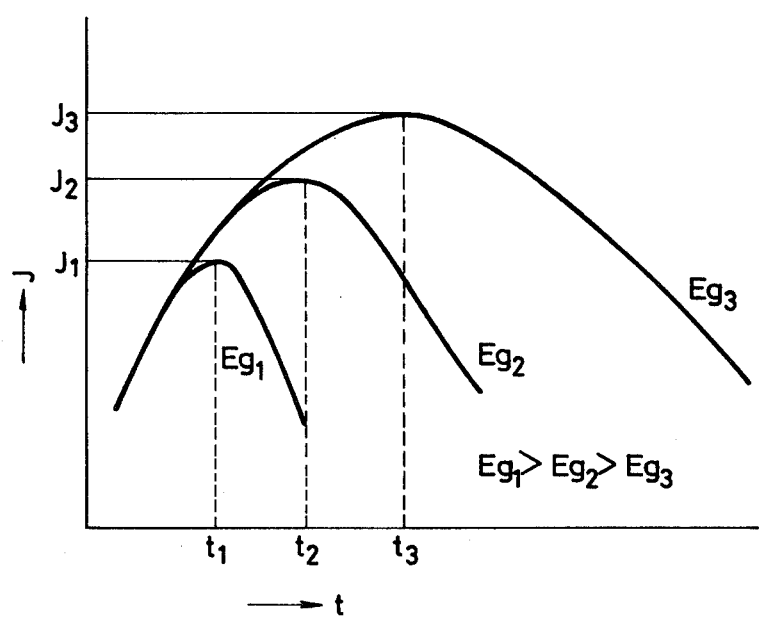
FIG. 5 illustrates the output current vs. i layer thickness characteristic of an upper nip cell.

FIG. 5 shows the characteristic of the output current vs. the i-layer thickness of the upper nip cell, where $Eg_1$, $Eg_2$ and $Eg_3$ are band-gap energies of the i layer in the lower nip cell, wherein $Eg_1 > Eg_2 > Eg_3$. The long wavelength light utilization efficiency increases according to the decrease of the band-gap energy Eg, and the output current (J) also increases with decreasing band-gap energies Eg. When a decrease in the quality of the a-Si:H layer can be ignored, the transducing efficiency of the tandem device increases if the low band-gap energy a-Si:H layer is used as the i layer in the lower nip cell. The decrease of the band-gap energy Eg causes a decrease in the open-circuit voltage (Voc) and the curve factor (FF). The a-SiGe:H layer for use in the tandem device as the low band-gap energy layer has a suitable Eg value selectable depending on the Ge content.

Figure 6:
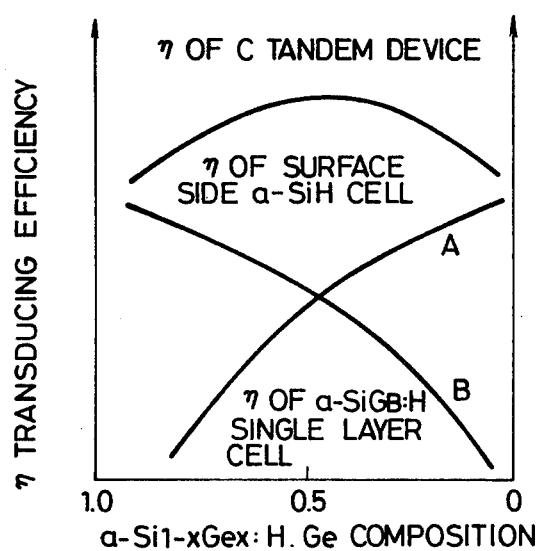
FIG. 6 illustrates the relation between the transducing efficiency $\eta$ and the Ge composition of an a-Si$_{1-x}$Ge$_x$:H layer.

FIG. 6 shows the transducing efficiency $\eta$ vs. the Ge composition of an a-$Si_{1-x}Ge_x$:H material. Curve A shows the characteristic of the a-SiGe:H structure lower nip cell. Curve B shows the characteristic of an a-Si:H upper nip cell and curve C shows the characteristic of the tandem device comprising these nip cells. When the tandem device uses an a-Si:H layer with a band-gap energy Eg of about 1.85 to 2.0 eV for the a-Si:H nip cell, the most suitable Ge composition (x) of a-$Si_{1-x}Ge_x$:H for the a-SiGe:H nip cell is about 0.2 to 0.7 and the most suitable i layer thickness of the a-Si:H upper nip cell in about 500 to 3000 Å.

Thus, this invention easily improves the electric properties of the solar cell. But in the tandem device generating the maximum output current, the most suitable thickness of the i layer in the a-Si:H nip cell is thinner than the most suitable thickness of the i layer of the conventional structure nip solar cell. The i layer thickness of the conventional solar cell is 0.4 to 1.0 $\mu$m. Because of the thin i layer thickness, the electromotive force of the tandem device is decreased.

Figure 7:
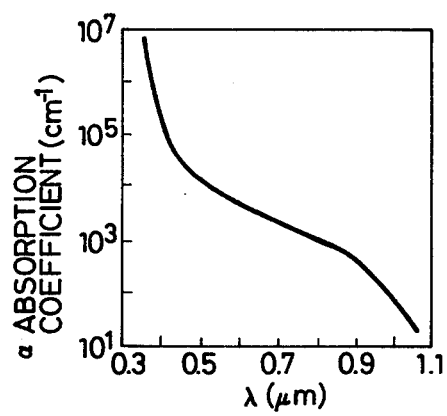
FIG. 7 shows the variation of the absorption coefficient $\alpha$ of an a-Si:H layer with the wavelength.

FIG. 7 shows the absorption coefficient $\alpha$ of the a-Si:H layer versus the wavelength. The quantity of the transmitted light through the a-Si:H layer can be designated by $\exp(-\alpha t)$, wherein t is the thickness of the a-Si:H layer in a wavelength region with a large absorption coefficient. The long wavelength light transmittance is not greatly dependent on the thickness of the a-Si:H layer.

Figure 8:
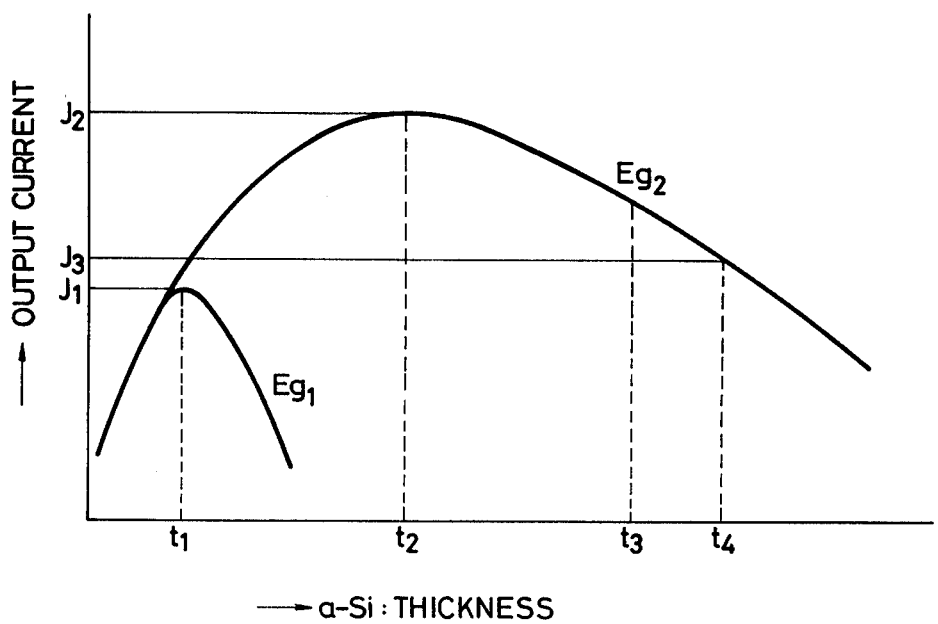
FIG. 8 is an output current (J) vs. thickness of i layer graph for an a-Si:H upper nip cell.

FIG. 8 shows the relation between the output current (J) and the thickness of the i layer in the a-Si:H upper nip cell. In FIG. 8, the i layer of the lower nip cell has the band-gap energy $Eg_2$. The curve $Eg_1$ shows the output current characteristic of a two-layer multi-structure solar cell comprising only a-Si:H layers.

A single nip cell with an a-Si:H i layer of thickness $t_1$ is connected onto a nip cell with an a-Si:H i layer thickness $t_3$ to form a two-layer multi-a-Si:H cell generating a maximum output current of $J_1$.

The maximum output current ($J_1$) is about ½ the maximum output current generated by the a-Si:H nip cell. The open-circuit voltage (Voc) of the two-layer multicell is twice the voltage of the single structure cell and the curve factor (FF) of the two-layer multicell is almost equal to the FF of the a-Si:H cell. In the two-layer multicell, the thickness $t_1$ of the a-Si:H upper nip cell is very critical.

In the double-layer tandem device with the a-Si:H layer sensitive to the long wavelength light region, the output current does not depend on the thickness of the a-Si:H layer of the a-Si:H single structure nip cell. The a-Si:H layer multicell with a thickness $t_4$ can be connected on the a-Si:H single structure nip cell to form a solar cell with an output current larger than the current $J_1$.

Figure 9:
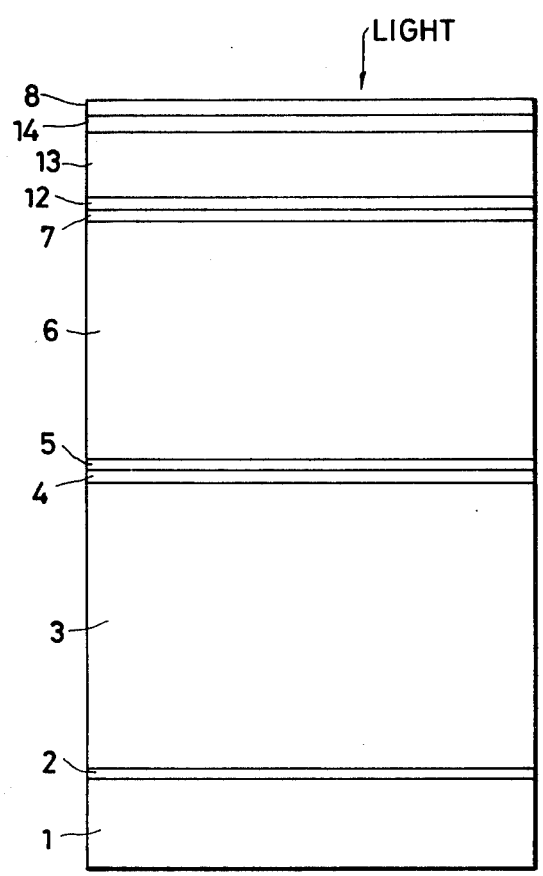
FIG. 9 is a sectional view of a three-layer tandem device.

FIG. 9 is a sectional view of a three-layer nip structure cell. Like characters designate corresponding parts in FIGS. 4 and 9. In FIG. 9, 12 is a p-type amorphous silicon (a-Si:H) layer, 13 is an intrinsic amorphous silicon (a-Si:H) layer and 14 is an n-type amorphous silicon (a-Si:H) layer.

The three-layer nip structure cell (herein designated as a three-layer tandem device) has following advantages:

1. The a-Si:H single structure nip cell with sensitivity to short wavelength light has a high photovoltaic effect.
p 2. The long wavelength light sensitivity of the a-Si:H nip cell is not required, enabling use of an a-Si:H layer with low Ge composition and with high Voc.

The three layer tandem device with the maximum output power has following size, materials and composition.

The a-Si$_{1-x}$Ge$_x$:H layer has a Ge composition x of about 0.2 to 0.7. The i layer thickness of the a-SiGe:H nip cell is 2000 to 10000 The i layer thickness of the a-Si:H nip cell with the thickness $t_3$, as shown in FIG. 8, is 2000 to 6000 Å. Eg is 1.85 to 2.0 eV.

The i layer thickness of the a-Si:H nip cell with the thickness $t_1$ is 400 to 1000 Å and Eg is 1.85 to 2.0 eV.

This invention thus provides an improved solar cell with high transducing efficiency comprising at least two laminated nip structure cells. The energy-gap of the i layer on the light receiving side is higher than the energy-gap of the i layer of the other cells.

What is claimed is:

1. A solar cell, comprising:
a first, p-type semiconductor layer of a first amorphous semiconductor material;
a second, intrinsic semiconductor layer of a second amorphous semiconductor material having an energy-gap lower than the gap of said first amorphous semiconductor material and formed on said first semiconductor layer;
a third, n-type semiconductor layer of said first amorphous semiconductor material formed on said second semiconductor layer;
a fourth, p-type semiconductor of said first amorphous semiconductor material formed on said third semiconductor layer;
a fifth, intrinsic semiconductor layer of said first amorphous semiconductor material formed on said fourth semiconductor layer;
a sixth, n-type semiconductor layer of said first amorphous semiconductor material formed on said fifth semiconductor layer;
a seventh, p-type semiconductor layer of said amorphous semiconductor material formed on said sixth semiconductor layer;
an eighth, intrinsic semiconductor layer of said first amorphous semiconductor material formed on said seventh semiconductor layer; and
a ninth, n-type semiconductor layer of said first amorphous semiconductor material formed on said eighth semiconductor layer, said ninth semiconductor layer having an incident light receiving surface.

2. A solar cell as claimed in claim 1, wherein said second amorphous semiconductor material comprises a compound of a first semiconductor, and a second semiconductor with an energy-gap lower than the gap of said first semiconductor.

3. A solar cell as claimed in claim 2, wherein said first semiconductor is silicon.

4. A solar cell as claimed in claim 2, wherein said second semiconductor is an alloy of silicon and germanium.

5. A solar cell as claimed in claim 1, wherein said first amorphous semiconductor material is amorphous silicon.

6. A solar cell, as recited in claim 5, wherein:
said second layer is amorphous Si$_{1-x}$Ge$_x$:H where x is between 0.2 and 0.7 and has thickness between 2,000 Å and 10,000 Å;
said fifth layer is amorphous Si:H having a thickness between 400 and 1,000 Å and a band-gap between 1.85 eV and 2.0 eV; and
said eighth layer is amorphous Si:H having a thickness between 400 Å and 1,000 Å and a band-gap between 1.85 eV and 2.0 eV.

7. A solar cell, comprising:
a first, p-type amorphous silicon layer;
a second, intrinsic amorphous Si$_{1-x}$Ge$_x$ layer formed on said first layer where x is between 0.2 and 0.7;
a third, n-type amorphous silicon layer formed on said second layer having a thickness between 50 and 200 Å;
a fourth, p-type amorphous silicon layer formed on said third layer, having a thickness between 50 and 200 Å;
a fifth, intrinsic amorphous silicon layer formed on said fourth layer, having a thickness between 500 and 3,000 Å; and
a sixth, n-type amorphous silicon layer formed on said fifth layer, said sixth layer having an incident light receiving surface.

* * * * *